United States Patent [19]

Greenstein et al.

[11] 4,133,701
[45] Jan. 9, 1979

[54] SELECTIVE ENHANCEMENT OF PHOSPHORUS DIFFUSION BY IMPLANTING HALOGEN IONS

[75] Inventors: Eugene Greenstein, Southfield; Bernard A. MacIver, Lathrup Village, both of Mich.

[73] Assignee: General Motors Corporation, Detroit, Mich.

[21] Appl. No.: 810,929

[22] Filed: Jun. 29, 1977

[51] Int. Cl.² .................... H01L 21/263; H01L 27/02
[52] U.S. Cl. ...................................... 148/1.5; 357/34; 357/40; 357/91
[58] Field of Search ...................... 148/1.5; 357/91, 34, 357/40

[56] References Cited

U.S. PATENT DOCUMENTS

| | | | |
|---|---|---|---|
| 3,756,862 | 9/1973 | Ahn et al. | 148/1.5 |
| 3,761,319 | 9/1973 | Shannon | 148/1.5 |
| 3,773,566 | 11/1973 | Tsuchimoto | 148/1.5 |
| 3,865,633 | 2/1975 | Shannon et al. | 148/1.5 |
| 3,933,530 | 1/1976 | Mueller et al. | 148/1.5 |
| 3,969,748 | 7/1976 | Horie et al. | 357/46 |
| 4,025,364 | 5/1977 | Smith | 148/1.5 |
| 4,030,954 | 6/1977 | Horie | 156/628 |
| 4,066,473 | 1/1978 | O'Brien | 148/1.5 |
| 4,069,068 | 1/1978 | Beyer et al. | 148/1.5 |

OTHER PUBLICATIONS

Motorola Monitor, vol. 8, No. 1 pp. 24 and 12.
Müller et al., "- B-doping of Si by Impln. of $BF_2$ Molecules", Ion Impln. in S/C ed. I. Ruge et al; Springer 1971 (85).
Beanland, "- B-Molecular Ion Impln. in Si," 5th Intl. Conf. on Ion Impln., Boulder, Colo., Aug. 1976.
Nicholas et al., "Reduced Gain of Ion-Implanted Transistors," Appl. Phys. Letts. 26 (1975) 320.
Bhatia et al., "Isolation Process for Shallow Junction Device, IBM - TDB, 19 (1971) 4171.
Crowder et al., "- Amorphorus Phase on B . . . in Implanted Si", Ion Impln. in S/C, ed. B. L. Crowder, Plenum Press 1973, 257.
S. Prussin, "Ternary Defects, - B, F, BF and $BF_2$ Ions in Si . . . " Ion Impln. in S/C, ed. S. Namba, Plenum, N. Y. (1975) 449.
Karmanov et al., ". . . P Diffusion in Ion-Bombarded Si" Sov. Phys. Semicond. 9 (1975) 1171.

*Primary Examiner*—L. Dewayne Rutledge
*Assistant Examiner*—Upendra Roy
*Attorney, Agent, or Firm*—Robert J. Wallace

[57] ABSTRACT

An improved method of making bipolar monolithic integrated circuits by successive diffusions of boron and phosphorus. Selective halogen ion implantation is used to locally specifically enhance phosphorus diffusion. The halogen implant is performed prior to the boron diffusion. Enhanced local phosphorus diffusion provides selected transistors in the circuit with a narrower base width than others, and a corresponding higher current gain than others. Analogously, higher value pinch resistors can be selectively produced in the circuit.

4 Claims, 5 Drawing Figures

PHOSPHORUS DRIVE-IN

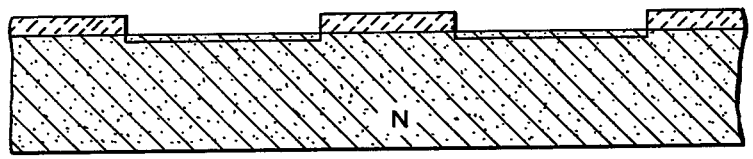
Fig. 1 — BORON PREDEPOSITION
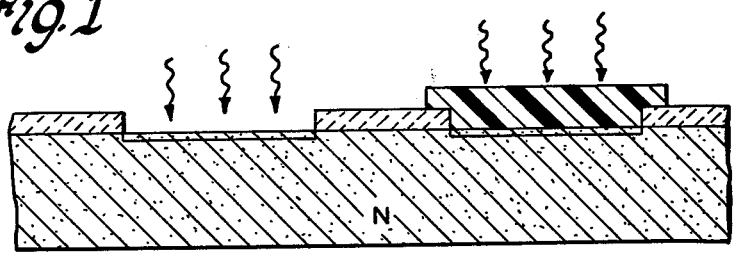
Fig. 2 — SELECTIVE HALOGEN IMPLANT
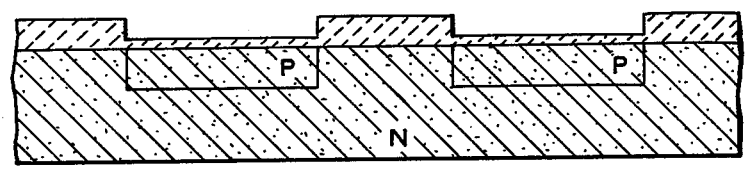
Fig. 3 — BORON DRIVE-IN
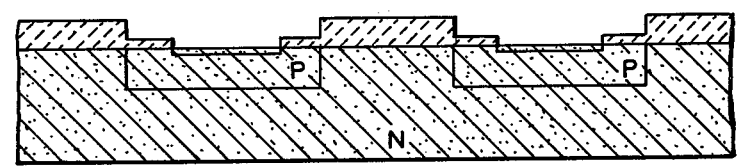
Fig. 4 — PHOSPHORUS PREDEPOSITION
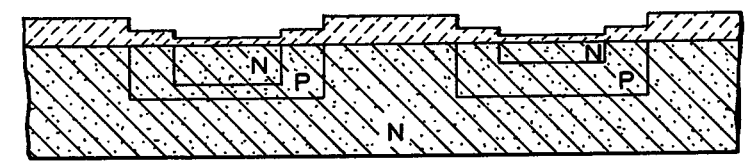
Fig. 5 — PHOSPHORUS DRIVE-IN

SELECTIVE ENHANCEMENT OF PHOSPHORUS DIFFUSION BY IMPLANTING HALOGEN IONS

BACKGROUND OF THE INVENTION

This invention relates to a method of making bipolar monolithic integrated circuits. It more particularly relates to a method of making such circuits by successive boron and phosphorus diffusions.

Bipolar monolithic integrated circuits are most often made in N-type silicon surfaces by successive diffusions of boron and phosphorus. The boron diffusion forms the middle layer of three layer devices, such as discrete transistors, in the integrated circuit. It is also used in reinforcing P-N junction isolation walls and in forming resistor units in the integrated circuit. The phosphorus diffusion forms an emitter region for discrete bipolar transistors in the integrated circuit. It is also used in forming resistors and interconnection paths. Ordinarily the boron is diffused identically into all surface portions where it is to form or reinforce a P-type doping region. Analogously, phosphorus is identically diffused into all surface portions where it is to reform or reinforce N-type doping. Boron diffuses to substantially the same depth in all regions, as does the phosphorus. Transistors, for example, all have about the same base width and correspondingly about the same current gain, regardless of power rating. Accordingly, the circuits must be designed with this limitation in mind.

It is appreciated that higher gain transistors can be selectively made in an integrated circuit by techniques already known in the prior art. For example, two base diffusions or two emitter diffusions could be used. Two different impurities of the same conductivity type, or two different surface concentrations of the same impurity can be used in the two diffusions. However, this entails an objectionable increase in the number and type of method steps that are needed. This can decrease yields and increase time and expense of manufacture. In addition, use of the lower surface concentration diffusion, to obtain a narrower base width, produces a lower doping level in the base region. A low doping level can cause undesirably high internal and contact resistance, and attendant electrical losses, in the base region. In view of such difficulties multiple diffusions are ordinarily avoided, the bipolar integrated circuits are normally made with transistors all having substantially the same current gain characteristics.

We have now found a simple and controllable technique for making some transistors in a boron-phosphorus diffused bipolar monolithic integrated circuit having a higher current gain. Gain on selected transistors can be increased in a simple and readily reproducible manner. The technique does not significantly decrease yields or significantly increase contact resistance, internal base resistance, or the time and expense of manufacture. Analogous advantages can be obtained when including pinch resistors in a bipolar monolithic integrated circuit.

OBJECTS AND SUMMARY OF THE INVENTION

It is an object of this invention to provide a simple and effective means for locally enhancing phosphorus diffusion in a selected one of a plurality of boron diffusion regions.

It is a further object of this invention to provide a simple and effective method for selectively making higher gain bipolar transistors in a monolithic integrated circuit without significantly altering normal and accepted successive boron and phosphorus diffusion practices.

The invention comprehends forming a high gain bipolar transistor in one discrete area of an N-type silicon surface and a lower current gain bipolar transistor in another discrete area of that silicon surface. Boron is predeposited onto both areas, for producing a P-type diffused base region in each area. The one area is then selectively irradiated with halogen ions to specifically enhance a subsequent phosphorus diffusion in that area. The predeposited boron is then driven into the wafer surface to form the P-type diffused base region. Boron diffusion is substantially unaffected by the halogen implant. Phosphorus is then diffused into both areas under the same conditions, forming a transistor-emitter region in each base region. However, the phosphorus diffuses more deeply into the base region of the one area than into the base region of the other area. The deeper phosphorus diffusion in the one area produces a narrower base region width and correspondingly higher current gain for the transistor formed therein as compared to the transistor formed in the other area.

The drawing schematically illustrates this method through a series of successive views, designated FIGS. 1 through 5.

DESCRIPTION OF THE PREFERRED EMBODIMENTS

Specific phosphorus diffusion enhancement can be obtained with fluorine, chlorine and bromine implants, as well as with $BF_2^+$. For comparison purposes, a plurality of sample transistors were prepared on each of several silicon wafers. The wafers were of 1.0 ohm-centimeter [111] N-type silicon about 0.0254 cm. thick. A bipolar transistor and pinch resistor were formed at each of a plurality of sites on each wafer surface. The sites were arranged in columns and rows and spaced about 1 millimeter apart. The transistor and pinch resistor pattern was repetitive. In forming these devices, a silicon dioxide coating about 7,000 angstroms thick was thermally grown on each wafer. Rectangular windows about 0.15 mm. by 0.26 mm. and about 0.08 mm. by 0.13 mm., for the transistor and pinch resistor respectively, were then opened in the silicon dioxide coating over each site by photoetching techniques, with the underlying silicon surface being exposed in each window. A 50 keV beam of boron ions was then uniformly applied to the whole surface of each wafer, in a dosage of approximately $5 \times 10^{14}$ boron ions/cm². Boron ions were thus relatively shallowly implanted in the silicon surface exposed in the windows in the silicon dioxide coating, and constitutes a controlled predeposition of boron for later drive-in.

One-half of each wafer was then mechanically masked to serve as a control for later comparison. The unmasked half was uniformly irradiated with a beam of halogen ions to implant halogen ions in unmasked oxide openings. Fluorine ions were implanted in the unmasked half of one wafer at 60 keV in a dosage of $1 \times 10^{15}$ fluorine ions/cm². Chlorine ions were implanted in the unmasked half of two other wafers at 140 keV in dosages of $1 \times 10^{15}$ chlorine ions/cm² and $5 \times 10^{15}$ chlorine ions/cm², respectively. Bromine ions were implanted in the unmasked halves of three more wafers at 144 keV in respective dosages of $1 \times 10^{15}$ bromine ions/cm², $3 \times 10^{15}$ bromine ions/cm² and $5 \times 10^{15}$ bromine ions/cm$^2$. The fluorine and chlorine ion beam energies provide a projected range of the fluorine and chlorine ions that is within 200 angstroms of the boron ion projected range. The bromine ions were implanted at the maximum energy of our equipment, but had a projected range somewhat less than that of the boron ions.

Still another silicon wafer was prepared as described above. However, during the boron ion implantation step described above, one-half of the wafer surface was mechanically masked, so that boron was implanted in only one-half of the wafer. The half of the wafer implanted with boron was then mechanically masked, and the other half implanted with BF$_2$ ions at 144 keV in a dose of 5 × 10$^{14}$ BF$_2$ ions/cm$^2$. In this BF$_2$ ion dosage, the boron dose on both halves of the wafer is substantially the same and the effective fluorine dose is 1 × 10$^{15}$ ions/cm$^2$.

The wafers were then placed in a furnace tube of about 7 cm. in diameter at 1,100° C., to drive-in the implanted boron. An atmosphere was flowed at about 2 liters per minute through the furnace tube. For the first 90 minutes of boron drive-in, the furnace atmosphere was dry oxygen. The atmosphere was then switched to wet oxygen for 20 minutes and back again to dry oxygen for 10 minutes, after which the wafers were removed from the furnace tube. The furnace tube was maintained at 1,100° C. during the entire drive-in. The wet oxygen atmosphere was prepared by flowing the furnace atmosphere through a 96° C. water bubbler before routing it into the furnace. The furnace treatment causes the predeposited boron to diffuse into the surface of the silicon about 1.5 × 10$^{-3}$ millimeters at each window site. The diffusion formed a P-type region useful in a pinch resistor or as a bipolar transistor base region. The depth of the boron diffusion was substantially equal in all windows, whether those windows were also implanted with halogen ions or not. As usual, a silicon dioxide coating about 5,000 angstroms thick is regrown in the windows during boron drive-in.

A smaller window was then opened to the wafer surface within the boundaries of each P-type boron diffusion region by photoetching techniques, for diffusing phosphorus into the boron diffusion region underlying each window. The smaller window was about 0.12 mm. square and slightly offset from center in boron diffusion regions for transistors. It was rectangular, about 0.05 mm. by 0.10 mm. and generally centered in the boron diffusion region for the pinch resistor, with its long sides parallel to the region long sides. The phosphorus diffuses through the window into the exposed surface portion of the boron diffusion region, to convert it back to N-type conductivity. This provides an emitter region for bipolar transistors and a pinching region for pinch resistors. Diffusion was accomplished by initially depositing phosphorus within each newly opened window. The phosphorus was deposited by exposing the wafers to a strong phosphorus oxychloride, or solid ceramic phosphorus source for 12 minutes at 1060° C. This produced a phosphorus glass on the surface of the silicon exposed within each newly opened window. Concurrently, the phosphorus diffused slightly below the silicon a short distance in a concentration of 1 × 10$^{21}$ phosphorus atoms/cm$^3$. The phosphorus glass was then removed from the window by immersion in buffered hydrofluoric acid for 30 seconds. All the wafers but the BF$_2$ ion implanted wafer were placed in a 7 cm. diameter furnace tube maintained at 1,000° C. for phosphorus drive-in. Wet oxygen was flowed through the tube for 20 minutes and dry nitrogen for 10 minutes, at a rate of about 2 liters per minute. The one wafer implanted with BF$_2$ ions was treated slightly differently to avoid driving the phosphorus entirely through the boron diffused base region, i.e., to avoid emitter punch through. This latter one wafer was placed in the 1,000° C. furnace tube for only 15 minutes in wet oxygen and 5 minutes in dry oxygen. During this treatment a silicon dioxide coating about 2,000 angstroms thick was regrown within the phosphorus diffusion window. The predeposited phosphorus concurrently diffused more deeply into the silicon surface to reform an N-type region within the boron diffusion region. However, unlike the boron diffusion, the phosphorus diffused more deeply at sites previously implanted with halogen ions than at sites that were not previously implanted with halogen ions. As to be expected, the boron ions diffused a little more deeply into the silicon during the phosphorus diffusion. Except for what appeared to be an emitter push effect in the more deeply diffused phosphorus regions, the added boron diffusion was substantially the same at all sites. The boron diffusion front stayed ahead of the phosphorus diffusion front in all cases. Accordingly, a three-layer bipolar device was formed at each window site. However, the distance between the phosphorus diffusion front and the boron diffusion front was smaller at the halogen implanted window sites than at the other sites. Hence, transistor base region widths were narrower at the halogen implanted sites, and the transistor current gains were correspondingly higher. Analogously, pinch resistor current flow paths were thinner and of higher resistance at halogen implanted sites.

Transistors were completed by photolithographically opening respective windows to the surface of the phosphorus diffusion region, to the portion of the circumscribing boron diffused region, and to the surrounding wafer surface. Pinch resistors were completed by photolithographically opening a window to the surface of the phosphorus diffusion region and two windows to the base region surface, on opposite sides of the phosphorus diffusion region. A discrete aluminum contact was then formed in each window by blanket evaporation of aluminum onto the wafer surface followed by photoetching. The wafers were then placed in a furnace at 480° C. for 10 minutes under forming gas. Bipolar transistors and pinch resistors were thus formed at each site on both halves of each wafer. Common emitter circuit gain, beta, and boron diffusion (base) region pinch resistance $R_{bp}$, were measured. $R_{bp}$ was used as a relative measure of base width because, unlike beta, it is independent of carrier lifetime. The common emitter current gain, beta, was measured at 250 microamperes and 2.5 volts for transistors prepared with a chlorine ion dosage of 5 × 10$^{15}$ ions per cm$^2$. In these latter transistors beta was measured at 500 microamperes and 1 volt because of the low collector-emitter breakdown voltage of these transistors.

Transistors and pinch resistors made at sites implanted with fluorine ions respectively exhibited a beta of 700 and $R_{bp}$ of 25 kiloohms/square compared to a beta of 140 and $R_{bp}$ of 10 kiloohms/square on the non-halogen implanted half of the same wafer. At BF$_2$ ion implanted sites measured transistor betas were 1250 and measured pinch resistors were 40 kiloohms/square. The control device on the other half of the same wafer had a beta of 110 and an $R_{bp}$ of 8 kiloohms/square. The transistors and pinch resistors at chlorine ion implanted sites respectively showed a gain in beta and $R_{bp}$ at dosages of $1 \times 10^{15}$ chlorine ions per square centimeter and $5 \times 10^{15}$ chlorine ions per square centimeter. In the wafer implanted with the lower dosage of chlorine ions, devices at chlorine implanted beta was 450 and $R_{bp}$ was 17 kiloohms/square, with the control devices on the other half of the same wafer having a beta of 140 and $R_{bp}$ of 10 kiloohms/square. In the wafer implanted with the higher dosage of chlorine ions, beta was 4,000 and $R_{bp}$ for devices at chlorine implanted sites was more than 10,000 kiloohms/square, with the control devices on the other half of the same wafer having a beta of 150 and $R_{bp}$ of 10 kiloohms/square. In the wafer implanted with $3 \times 10^{15}$ bromine ions per $cm^2$, beta was 900 and $R_{bp}$ was 50 kiloohms/square at the bromine implanted sites, control devices on the same wafer having a beta of 200 and $R_{bp}$ of 15 kiloohms/square. Apparently, a slightly higher dose of bromine ions is needed to obtain enhanced phosphorus diffusion. A dose of $1 \times 10^{15}$ bromine ions per $cm^2$ did not increase beta or $R_{bp}$, and in fact slightly reduced it. The foregoing are mean values for 10 to 15 transistors and resistors tested on each wafer half.

A silicon monolithic integrated circuit containing bipolar transistors with both higher and lower gain characteristics can be produced using the foregoing techniques. The circuit can be formed in [111] N-type silicon of 1.0 ohm-centimeter resistivity. Normally, a plurality of such circuits would be simultaneously formed in a single silicon wafer. In addition, it may be desirable to form such circuits in an epitaxially deposited higher resistivity silicon layer on the surface of the wafer. In this latter instance, PN junction or dielectric isolation and sub-collectors can readily be included in the circuit. Such added microcircuit features and process steps are not precluded by this invention, nor are they required. Accordingly, for simplicity, they shall not be included in the following description. They form no part of this invention. Boron-phosphorus diffused monolithic integrated circuits of many types can be prepared according to normal and accepted boron and phosphorus diffusion practices with the only difference being an added halogen implant before phosphorus is driven-in. It is recognized that $BF_2$ ions may be a convenient source of halogen ions. If so, boron would not be predeposited at sites where fluorine implantation is desired. The boron would be codeposited with the fluorine during $BF_2$ ion implantation, as mentioned in the preceding examples.

In making a silicon bipolar monolithic integrated circuit in accordance with this invention, base diffusion windows are opened in a masking silicon dioxide layer by photo-etching or the like. Base diffusion is generally accomplished in two steps, the first being a step in which boron is predeposited on the wafer surface exposed within the base diffusion window. After predeposition, the silicon wafer is heated to a high temperature to drive the boron into the silicon surface to a predetermined depth. Predeposition can be accomplished chemically by exposing the wafer to a gaseous atmosphere containing boron, as for example boron trifluoride. However, we prefer to predeposit the boron in a more controlled manner, using the ion implantation techniques hereinbefore described. Extremely high emitter concentrations are normally desired. Such concentrations can normally be adequately controlled in chemical deposition techniques. Accordingly, we prefer to use chemical deposition techniques for predeposition of phosphorus, as for example exposure of the wafer to phosphorus oxychloride, phosphorus pentoxide, or the like. Since ion implantation is used to predeposit the boron, it is more convenient to implant the halogen ions at the same point in the process. By that we mean immediately before or after, and even during boron implantation.

Reference is now made to FIG. 1 of the drawing. In our preferred method, the entire surface of the wafer is exposed to the boron ion beam, to implant boron in every base diffusion window. The windows where a normal rate of phosphorus diffusion is desired are then selectively covered with a photoresist coating that protects those windows from a halogen ion beam, as shown in FIG. 2. The photoresist coating is applied in the normal and accepted way, leaving those base diffusion windows open where the halogen implant and enhanced phosphorus diffusion is desired.

The wafer is then exposed to a halogen ion beam, illustrated by the arrows in FIG. 2. A beam energy is selected to give the halogen ions a projected range into the silicon that is generally about the same as the depth at which the boron is predeposited. The dosage should be at least $1 \times 10^{15}$ halogen ions per square centimeter and effective to produce a predetermined acceleration in the phosphorus diffusion rate. It is expected that other beam energies can be used as long as they provide a sufficient halogen doping. Analogously, with different beam energies, greater or lesser dosages may be required. After the halogen implant, the wafer is then treated in the normal way in which one would otherwise drive the implanted boron into the silicon surface to form a base region at each window. This treatment is usually at a higher temperature in an oxidizing atmosphere which concurrently reforms a silicon dioxide coating in each window. Boron drive-in is shown in FIG. 3.

Smaller windows are opened in the reformed silicon dioxide and other silicon dioxide portions to form emitter regions within the base regions, resistor configurations, and interconnecting conductor regions. Attention is now directed to FIG. 4 of the drawing. Phosphorus is deposited in any convenient manner onto wafers. The phosphorus is then driven into the silicon surface exposed in each window, as shown in FIG. 5. As mentioned, the phosphorus will diffuse more deeply into window sites previously implanted with halogen ions. The phosphorus diffusion reforms an N-type region where it diffuses into the P-type boron diffusion region and an N+-type region where it diffuses into other wafer surface portions (not shown). The phosphorus would normally be diffused at an elevated temperature in an oxidizing atmosphere, which reforms a silicon dioxide coating in the phosphorus diffusion windows.

Contact windows for the circuit components are then opened by photoetching and the wafer surface suitably metallized in the desired pattern. An integrated circuit results, in which transistors formed in halogen ion implanted sites will have a narrower base width and correspondingly higher gain than transistors formed in the areas not implanted with halogen ions.

We claim:

1. In a method of making a bipolar monolithic integrated circuit that includes the steps of diffusing boron and then phosphorus into at least two discrete areas of an N-type silicon surface to form a discrete bipolar electrical component at each area, the improvement which comprises, selectively enhancing phosphorus diffusion in one of said areas by implanting halogen ions into said one area before boron diffusion effective to produce a deeper phosphorus diffusion in said one area than said other area without also enhancing the boron diffusion, whereby a closer spacing between boron and phosphorus diffusion fronts is obtained in said one area than said other area.

2. In a method of making a bipolar monolithic integrated circuit that includes the steps of diffusing boron and then phosphorus into at least two discrete areas of an N-type silicon surface to form a discrete bipolar transistor at each area, the improvement which comprises, selectively enhancing phosphorus diffusion in one of said areas by implanting halogen ions into said one area of said surface before boron diffusion, whereby the transistor formed in said halogen ion implanted area has a narrower base width and a higher gain than the transistor formed in the other area.

3. A method of using one boron diffusion and one phosphorus diffusion to simultaneously make both high gain and low gan bipolar transistors in a monolithic integrated circuit, said method comprising:
providing an N-type silicon surface having a first discrete area where a higher gain transistor is to be formed and a second discrete area where a lower gain transistor is to be formed;
implanting halogen ions in only the first of said areas in a dosage of at least $1 \times 10^{15}$ halogen ions per square centimeter, effective to accelerate phosphorus diffusion in said first area but not said second area;
providing an identical surface concentration source of boron for diffusion into both said first and second areas;
diffusing said boron simultaneously into both areas to form transistor base regions thereat of substantially similar depth below said silicon surface;
providing an identical surface concentration source of phosphorus for diffusion into both areas; and
diffusing said phosphorus simultaneously into both of said base regions to form transistor emitter regions therein, with the emitter region in said first area having a depth greater than the emitter region in the second area, resulting in a narrower base width and higher gain transistor in said first area than in said second area.

4. A method of making bipolar transistors with mutually different gain characteristics in a monolithic integrated circuit comprising the steps of:
identically depositing boron by ion implantation onto a plurality of discrete areas of an N-type silicon surface where bipolar transistors are to be formed;
masking a first plurality of said areas to isolate them from a halogen ion beam;
irradiating an unmasked second plurality of said areas with a halogen ion-containing beam in a dosage of at least $1 \times 10^{15}$ ions per square centimeter effective to enhance phosphorus diffusion at said second plurality of areas, said halogen being a member selected from the group consisting of fluorine, chlorine and bromine, said irradiation implanting said halogen ions to a depth below said surface about as deep as boron ions enter said surface in said boron deposition;
diffusing the deposition boron simultaneously into said first and second areas to form transistor base regions of generally similar depths beneath said silicon surface;
identically depositing phosphorus onto said silicon surface within said first and second plurality of areas for providing bipolar transistor emitter regions within said base regions; and
diffusing said phosphorus into said surface to form deeper emitter regions in said first plurality of areas than in said second plurality of areas, whereby bipolar transistors of narrower base width and higher gain are formed in said first plurality of areas than in said second plurality of areas.

* * * * *